«12» United States Patent
Hsu

(10) Patent No.: US 7,202,758 B2
(45) Date of Patent: Apr. 10, 2007

(54) SIGNAL TRANSMISSION STRUCTURE HAVING PLURAL REFERENCE PLANES WITH NON-OVERLAPPING OPENINGS

(75) Inventor: Jimmy Hsu, Taipei Hsien (TW)

(73) Assignee: Via Technologies, Inc., Taipei Hsien (TW)

( * ) Notice: Subject to any disclaimer, the term of this patent is extended or adjusted under 35 U.S.C. 154(b) by 33 days.

(21) Appl. No.: 11/036,119

(22) Filed: Jan. 14, 2005

(65) Prior Publication Data

US 2006/0071739 A1  Apr. 6, 2006

(30) Foreign Application Priority Data

Oct. 4, 2004  (TW)  .............................. 93129967 A

(51) Int. Cl.
*H01P 3/08* (2006.01)
(52) U.S. Cl. ........................................ 333/33; 333/246
(58) Field of Classification Search .................. 333/1, 333/238, 33, 246; 174/255
See application file for complete search history.

(56) References Cited

U.S. PATENT DOCUMENTS 5,003,273 A * 3/1991 Oppenberg .................... 333/1
5,479,138 A * 12/1995 Kuroda et al. ................. 333/1
6,624,729 B2 * 9/2003 Wright et al. ............... 333/238

* cited by examiner

*Primary Examiner*—Benny Lee
(74) *Attorney, Agent, or Firm*—J.C. Patents

(57) ABSTRACT

A signal transmission structure including a signal line, a first reference plane with a first opening, and a second reference plane with a second opening is provided. The first reference plane is disposed beside the signal line, and a portion of the signal line passes through a position of the first opening. In addition, the second reference plane is disposed beside the first reference plane, and the second opening is in a position corresponding to the position of the first opening, while the outline of the second opening projected onto the first reference plane does not overlap with the position of the first opening. Therefore, at high frequency-transmission, the above structure can reduce the insertion loss resulted from impedance mismatch as the signal passes through the opening, and reduce the resonance induced by the coupling between two reference planes to enhance the quality of signal transmission.

20 Claims, 2 Drawing Sheets

SIGNAL TRANSMISSION STRUCTURE HAVING PLURAL REFERENCE PLANES WITH NON-OVERLAPPING OPENINGS

CROSS-REFERENCE TO RELATED APPLICATION

This application claims the priority benefit of Taiwan application serial no. 93129967, filed on Oct. 4, 2004.

BACKGROUND OF THE INVENTION

1. Field of the Invention

This invention generally relates to a signal transmission structure, and more particularly to a signal transmission structure for minimizing the power noise induced when signals pass through imperfect reference plane.

2. Description of Related Art

The signal line for connecting two devices or two terminals in a large-scale printed circuit board or a packaging substrate has to maintain a uniform line width in order to keep a constant characteristic impedance when an electronic signal is transmitted in the signal line. A good impedance matching design between two terminals is required to reduce the reflection due to the impedance mismatch especially when the signal is transmitted in a high speed and a high frequency environment. That is, the insertion loss should be reduced and the reduction of the return loss should be increased when transmitting the signals so that the quality of the signal transmission will not be affected.

FIG. 1 shows a cross-sectional view of a conventional signal line passing through a imperfect plane. The conventional signal transmission structure 100 includes a signal line 110, a first reference plane 120 and a second reference plane 130, sequentially. Wherein, the width of signal line 110 is uniform, and the first reference plane 120 and the second reference plane 130 are a power plane and a ground plane, respectively, for example. It is important to note that in a conventional circuit design, the first reference plane 120 can form a slot due to the hole drilling or cutting between the planes, or imperfect planes can be formed (such as a non-reference area opening 122) for avoiding short circuit in adjacent signal lines. As a result, a high impedance variation occurs at the non-reference area opening 122 when the signal is transmitted in the signal line 130 such that the impedance mismatch increases of the insertion loss. Therefore, the signal cannot be transmitted without a loss from one terminal of the non-reference area opening 122 to the other terminal of the non-reference area opening 122.

Meanwhile, when the signal passes by the non-reference opening 122, due to the sudden variation of voltage and current, the signal will stimulate the coupling of signal line 110 and power plane 130 and resonance behaviors of ground plane 120 and power plane 130, leading to power noise interference and deteriorating the quality of signal transmission.

In light of the above, the frequency increases, the return loss decreases and the corresponding characteristic impedance increases when the signal line passes through the imperfect reference area. Moreover, the difference in the characteristic impedance from the original design is increased such that the impedance mismatch in the signal lines is much more serious.

SUMMARY OF THE INVENTION

Accordingly, an object of the present invention is to provide a signal transmission structure for improving the quality of signal transmission by decreasing power noise interference.

Another object of the present invention is to provide a signal transmission structure for reducing the characteristic impedance mismatch when the signal line passes through a non-reference area.

To achieve the above and other objects, the present invention provides a signal transmission structure for a circuit board, the structure comprising a signal line, a first reference plane and a second reference plane. The first reference plane, which is positioned near the signal line, has a first opening, a portion of the signal line passing along with the position of the first opening. Further, the second reference plane, which is positioned near the first reference plane, has a second opening in a position corresponding to the first opening, and the outline of the second opening projected on the first reference plane does not overlap with the position of the first opening.

According to one embodiment of the present invention, the above mentioned first reference plane and the second reference plane are positioned, for example, on same side or different sides of the signal line. The first reference plane and the second reference plane are either a power planes or a ground plane.

In the signal transmission structure of the present invention, the second reference plane is cut to form a non-reference area opening, i.e. second opening, which is larger than the first opening, such that the resonance induced by the coupling between the first and second reference planes is reduced. Moreover, when the signal passes through the signal line, parasitic capacitance, which is induced by the first reference plane and at least one protrusion portion, is able to improve characteristic impedance mismatch, thus improving signal transmission quality.

The above and other features of the present invention will be better understood from the following detailed description of the embodiments of the invention that is provided in conjunction with the accompanying drawings.

DESCRIPTION OF THE EMBODIMENTS

First Embodiment

Figure 1:
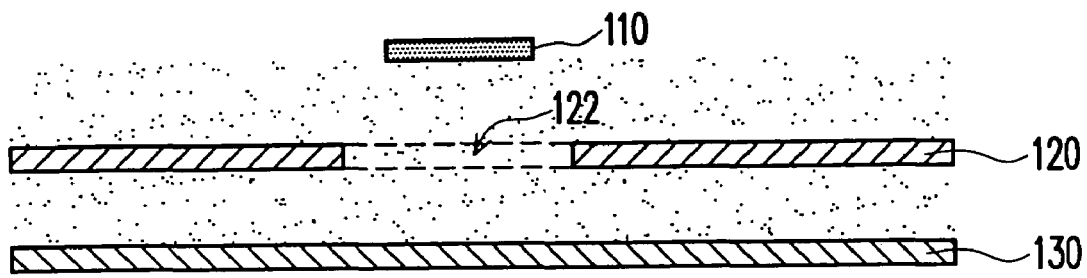
FIG. 1 shows a cross-sectional view of a signal line passing along with a non-perfection reference plane.
Figure 2:
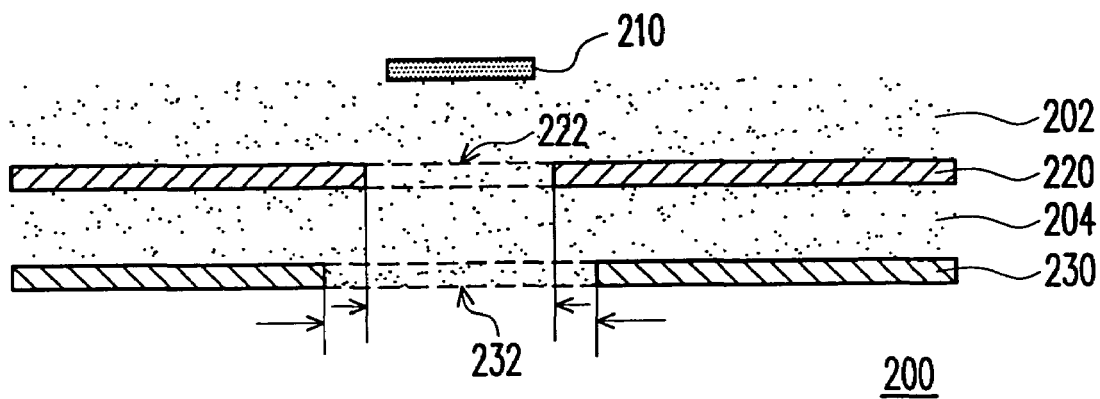
FIG. 2 shows a cross-sectional view of a signal transmission structure according to the first embodiment of the present invention.

FIG. 2 shows a cross-sectional view of a signal transmission structure in accordance with a first embodiment of the present invention. The signal transmission structure 200 is adaptive for a circuit board such as a printed circuit board or a packaging substrate. The signal transmission structure 200 comprises a signal line 210, a first reference plane 220 and a second reference plane 230. The signal line 210, for example, is a signal line with uniform width. The first reference plane 220 is positioned at one side of the signal line 210. The signal line 210 can be overlapped the first reference plane 220 with dielectric layers 202 in between, and the first reference plane 220 can be overlapped the second reference 230 with dielectric layer 204 in between. Moreover, the first reference plane 220, for example, is a power plane or a ground plane, and has a non-reference area formed thereon due to drilling or cutting, such as a non-reference area opening 222 (i.e. "a first opening", hereinafter). The second reference plane 230, for example, is a power plane or a ground plane, and has a second opening 232 formed thereon. The first reference plane 220 and the second reference plane 230, for example, are positioned at the same side of the signal line 210.

DETAIL DESCRIPTION OF THE PREFERRED EMBODIMENTS

It is noted that when a portion of the signal line passes by the first opening 222 of the non-reference area, in order to avoid the coupling of the signal line 210 and the power plane, such as second reference plane 230, and resonance induced by the coupling of the ground plane, such as the first reference plane 220, and the power plane, such as the second reference plane 230, a non-reference area opening 232 (i.e. "a second opening", hereinafter) is formed on the second reference plane 230 of the signal transmission structure 200 by cutting, in which the second opening 232 is positioned at a position corresponding to the first opening 222. That is to say, when a portion of the signal line 210 passes above the first opening 222 of the first reference plane 220, the portion of the signal line 210 also passes above the second opening 232 of the second reference plane 230 at the same time, such that the resonance induced by the coupling of the ground plane and that of the power plane can be prevented. Especially, when the projection of the second opening 232 on the first reference plane 220 has an outline that does not overlap with the position of the first opening 222, the power noise interference can be reduced more effectively.

As above mentioned, in the first embodiment of the present invention, at the same time the signal line 210 passes over the first opening 222 of the first imperfect reference plane 220 and over the second opening 232 of the second imperfect reference plane 230 at the same side. The cross section of the first opening 222 of the first reference plane 220 is less than that of the second opening 232 of the second reference plane 230, and the area of the second opening 232 projected on the first reference plane 220 totally contains the outline of the first opening 222. That is, the projected outline of the second opening 232 does not overlap or cross with the outline of the first opening 222. In other words, the projected outline of the second opening 232 on the first reference plane 220 and the position of the first opening 222 are not overlapped, such that power noise interference can be effectively prevented. The phrase "projected on" in the various embodiments of the present invention is defined to be as that a person when using FIG. 2, 3, 4 is looking straight down pass the second reference plane and down onto the first reference plane and at the same time a corresponding "shadow", so to speak, could be thought of being "projected" onto the first reference plane.

Second Embodiment

Figure 3:
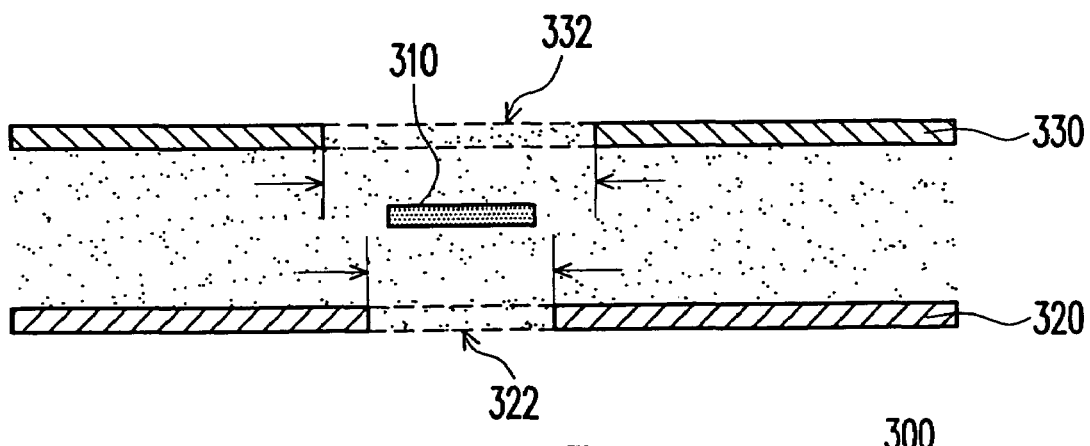
FIG. 3 shows a cross-sectional view of a signal transmission structure according to the second embodiment of the present invention.

FIG. 3 shows a cross-sectional view of a signal transmission structure in accordance with a second embodiment of the present invention. The signal transmission structure 300 comprises a signal line 310, a first reference plane 320 and a second reference plane 330. Different from the first embodiment, the first reference plane 320 and the second reference plane 330 are respectively positioned above and below the signal line 310. The signal line 310, for example, is with uniform width. The first reference plane 320 and the second reference plane 330 are, for example, a power plane and a ground plane. Due to drilling or cutting, a portion of the first reference plane 320 and the second reference plane 330 form a non-reference area. For example, a first opening 322 and a second opening 332 of the non-reference areas are respectively formed on the first reference plane 320 and the second reference plane 330, wherein the second opening 332 is in a position corresponding to a position of the first opening 322. Likewise, the outline of the second opening 332 projected on the first reference plane 320 does not overlap with the position of the first opening 322.

Therefore, in the second embodiment of the present invention, the signal line 310 passes between the first opening 322 of the reference plane 320 and the second opening 332 of the reference plane 330 in the cross-sectional view, which are two imperfect reference planes and positioned at different sides of the signal line 310, such that power signal interference can be reduced. Accordingly, the coupling of the signal line 310 and the power plane, such as the second reference plane 330, and resonance induced by the coupling of the ground plane, such as the first reference plane 320, and the power plane, such as the second reference plane 330, can be avoided, and the signal transmission quality can be improved.

Third Embodiment

Figure 4:
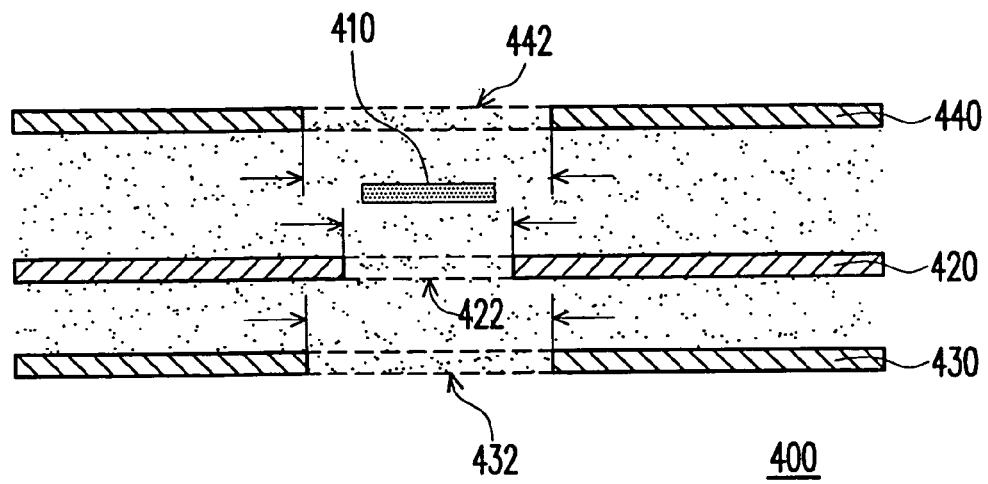
FIG. 4 shows a cross-sectional view of a signal transmission structure according to the third embodiment of the present invention.

FIG. 4 shows a cross-sectional view of a signal transmission structure in accordance with the third embodiment of the present invention. The signal transmission structure 400 comprises, for example, a signal line 410, a first reference plane 420, a second reference plane 430 and a third reference plane 440. Compared with the previous embodiments, the first reference plane 420 and the second reference plane 430 are positioned at the same side of the signal line 410, for example, and the third reference plane 440 is positioned at an opposite side of the signal line 410. The signal line 410 is, for example, with uniform width. The first reference plane 420, the second reference plane 430 and the third reference plane 440 are, for example, a power plane and a ground plane. Due to drilling or cutting, a portion of the first reference plane 420, the second reference plane 430 and the third reference plane 440 form a plurality of non-reference areas which are, for example, a first opening 422, a second opening 432 and a third opening 442. The second opening 432 and third opening 442 are in a position corresponding to a position of the first opening 422, respectively. In the same case, then outline of the second opening 432 projected on the first reference plane 420 and the outline of the first opening 422 do not overlap, and the outline of the third opening 442 projected on the first reference plane 420 and the outline of first opening 422 do not overlap.

Therefore, in the third embodiment of the present invention, the signal line 410 passes through the first opening 422 of the reference plane 420 and the second opening 432 of the reference plane 430 and third opening 442 of the third reference plane 440 at the opposite side, wherein these reference planes 420, 430 and 440 are all non-perfection reference planes. By such an arrangement, the coupling of the signal line 410 and the power plane (such as the second reference plane 430 and third reference plane 440) and resonance induced by the coupling of the ground plane (such as the first reference plane 420) and the power plane (such as the second reference plane 430 and third reference plane 440) can be reduced and signal transmission quality can be improved.

Figures 5A, 5B:
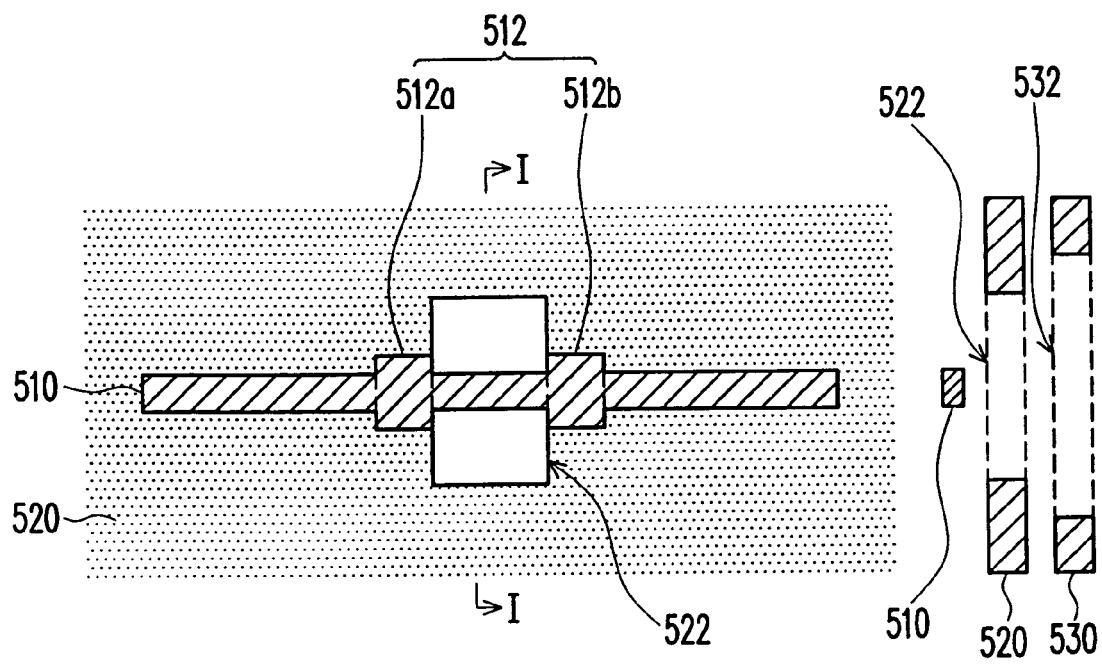
FIGS. 5A and 5B respectively show a top view of signal line passing along with a non-perfection reference plane according to another embodiment of the present invention and a cross-sectional view along line I—I.

In the foregoing first, second and third embodiments of the present invention, the signal lines with uniform width are cited as an example, but signal lines with partly widened portions passing through the mentioned openings of imperfect reference planes can also be used in the present invention. FIGS. 5A and 5B respectively show a top view of a signal line passing through a imperfect reference plane according to another embodiment of the present invention and a cross-sectional view along line I—I of FIG. 5A. The signal line 510 comprises, for example, a protrusion portion 512 with larger line width, which is in a position corresponding to a first opening 522 and is extended outside the first opening 522. In the present embodiment, the protrusion portion 512 comprises, for example, as seen in FIG. 5A, a first protrusion part 512a and a second protrusion part 512b, which are in positions respectively at two sides of the first opening 522 along an extension direction of the signal line 510. In a preferred situation, the first protrusion part 512a and the second protrusion part 512b are distributed at both sides of the first opening 522 in a dumbbell shape, for example, for increasing equivalent capacitance between the signal line 510 and the first reference plane 520. Further, the second reference plane 530 has a second opening 532 in a position corresponding to the first opening 522, as seen in FIG. 5B, which can restrain power noise interference as mentioned.

With reference to FIGS. 5A and 5B, by increasing equivalent capacitance C of the protrusion portion 512 of the signal line 510 (Note: the larger width of the signal line, the higher equivalent capacitance C), the characteristic impedance Z of the signal line 510 is decreased due to parasitic capacitance effect when the signal line 510 passes by an opening 522 of a non-reference area (Note: the higher equivalent capacitance C, the lower characteristic impedance Z). By such arrangement, the characteristic impedance Z of the signal line 510 could be closer to the originally designed characteristic impedance when the signal line 510 passes through a perfection reference plane, to achieve the purpose of impedance matching. Further, the protrusion portion 512 of the signal line 510 in the present invention can, with different shapes, cover whole area or part area of the first opening 522, with the same effect and principle as mentioned.

In light of the above, the signal transmission structure of the present invention has at least the following advantages.

1. In the signal transmission structure of the present invention, another reference plane is cut to form another opening of a non-reference area, which decreases the coupling of the signal line and a power plane and the resonance induced by coupling of two imperfection reference planes.

2. The signal transmission structure of the present invention can restrain the power noise interference effectively, which improves signal transmission quality.

3. By increasing the equivalent capacitance of the protrusion portion of the signal transmission structure in the present invention, the reduction of the return loss when the signals pass through the non-reference area can be enhanced.

4. The signal transmission structure of the present invention can reduce the insertion loss by increasing the equivalent capacitance of the protrusion portion of the signal transmission structure, so that a high frequency signal can be transmitted completely and the energy loss can be reduced substantially.

5. The signal transmission structure of the present invention can be widely applied in a large-scale printed circuit board or a packaging substrate.

What is claimed is:

1. A signal transmission structure for a circuit board, the signal transmission structure comprising:
    a signal line;
    a first reference plane disposed on a first side of said signal line, wherein said first reference plane has a first opening, and a portion of said signal line passes by a position of said first opening; and
    a second reference plane disposed on a first side of said first reference plane, wherein said second reference plane comprises a second opening in a position corresponding to said first opening, and the projection of said second opening on said first reference plane has an outline that does not overlap with the position of said first opening;
    wherein the area of said second opening is larger than the area of said first opening.

2. The signal transmission structure of claim 1, wherein said second reference plane is either a power plane or a ground plane.

3. The signal transmission structure of claim 1, wherein said first reference plane and said second reference plane are at the same side of said signal line.

4. The signal transmission structure of claim 3, further comprising a third reference plane disposed on a second side of said signal line, wherein the second side of said signal line is opposite to the first side of said signal line, wherein said third reference plane has a third opening in a position corresponding to said first opening, and the projection of said third opening on said first reference plane has an outline that does not overlap with the position of said first opening.

5. The signal transmission structure of claim 4, wherein the area of said third opening is larger than the area of said first opening.

6. The signal transmission structure of claim 1, wherein said first reference plane is either a power plane or a ground plane.

7. The signal transmission structure of claim 1, wherein a portion of said signal line comprises at least a protrusion portion, which extends in an area adjacent to and above said first opening and protrudes from opposite edges of said signal line.

8. The signal transmission structure of claim 7, wherein said protrusion portion comprises a first protrusion part and a second protrusion part, and said first protrusion part and said second protrusion part are located, respectively, at two ends of a segment of said signal line, said segment crosses over said first opening.

9. The signal transmission structure of claim 8, wherein said first protrusion part, said second protrusion part and said segment define a dumbbell shape.

10. The signal transmission structure of claim 7, wherein the line width of said protrusion portion is larger than the line width of a segment of said signal line, said segment crosses over said first opening.

11. A signal transmission structure for a circuit board, the signal transmission structure comprising:
    a signal line;
    a first reference plane disposed on a first side of said signal line, wherein said first reference plane has a first opening, and a portion of said signal line passes by a position of said first opening; and a second reference plane disposed on a second side of said signal line opposite to the first side of said signal line, wherein said second reference plane comprises a second opening in a position corresponding to said first opening, and the projection of said second opening on said first reference plane has an outline that does not overlap with the position of said first opening;

wherein the area of said second opening is larger than the area of said first opening.

12. The signal transmission structure of claim 11, further comprising a third reference plane, wherein said third reference plane is disposed either on the first side of said signal line, or on the second side of said signal line, wherein said third reference plane has a third opening in a position corresponding to said first opening, and the projection of said third opening on said first reference plane has an outline that does not overlap with the position of said first opening.

13. The signal transmission structure of claim 12, wherein the area of said third opening is larger than the area of said first opening.

14. A signal transmission structure of a circuit board, at least comprising:

a signal line;

a first power plane having a first opening, wherein a portion of the signal line passes by the first opening;

a second power plane having a second opening in a position corresponding to the first opening; and wherein the projection of the second opening on the first power plane has an outline that does not overlap with the position of the first opening;

wherein the signal line is disposed between the first power plane and the second power plane;

wherein the area of the second opening is larger than the area of the first opening.

15. The signal transmission structure of claim 14, wherein the region between any two of the signal line, the first power plane, and the second power plane has at least one dielectric layer.

16. A signal transmission structure of a circuit board, at least comprising:

a signal line;

a first reference plane having a first opening, wherein a portion of the signal line passes by the first opening;

a second reference plane having a second opening in a position corresponding to the first opening; and wherein the projection of the second opening on the first reference plane has a first outline that does not overlap with the position of the first opening;

wherein the signal line is outside the region between the first reference plane and the second reference plane;

wherein the area of the second opening is larger than the area of the first opening;

wherein at least one dielectric layer is disposed between any two of the signal line, the first reference plane, and the second reference plane.

17. The signal transmission structure of claim 16, further comprising:

a third reference plane having a third opening in a position corresponding to the first opening; wherein the projection of the third opening on the first reference plane has a second outline that does not overlap with the first opening.

18. The signal transmission structure of claim 17, wherein the area of the third opening is larger than the area of the first opening.

19. The signal transmission structure of claim 16, wherein the first reference plane is a power plane or a around plane, and the second reference plane is a power plane or a ground plane.

20. The signal transmission structure of claim 16, wherein the signal line have a protrusion portion; wherein the protrusion portion has a first protrusion part and a second protrusion part, wherein the first protrusion part is disposed above the area of a first end of the first opening and the second protrusion part is disposed above the area of a second end of the first opening.

* * * * *